United States Patent [19]

Majumdar

[11] Patent Number: 4,841,345

[45] Date of Patent: Jun. 20, 1989

[54] MODIFIED CONDUCTIVITY MODULATED MOSFET

[75] Inventor: Gourab Majumdar, Itami, Japan

[73] Assignee: Mitsubishi Denki Kabushiki Kaisha, Itami, Japan

[21] Appl. No.: 900,443

[22] Filed: Aug. 26, 1986

[30] Foreign Application Priority Data

Aug. 27, 1985 [JP] Japan .................................. 60-190734
Aug. 27, 1985 [JP] Japan .................................. 60-190735

[51] Int. Cl.$^4$ ...................... H01L 29/78; H01L 29/74; H01L 27/02
[52] U.S. Cl. .................................. 357/23.4; 357/23.1; 357/23.8; 357/38; 357/43; 357/86
[58] Field of Search ..................... 357/23.1, 23.4, 23.8, 357/86, 38, 38 T, 43

[56] References Cited

U.S. PATENT DOCUMENTS

| 3,227,896 | 1/1966 | Teszner ................................ 357/23.8 |
| 4,236,169 | 11/1980 | Nakashima et al. ................... 357/86 |
| 4,561,008 | 12/1985 | Becke ..................................... 357/86 |

FOREIGN PATENT DOCUMENTS

| 0080044 | 6/1983 | European Pat. Off. .......... 357/38 T |
| 3002526 | 8/1980 | Fed. Rep. of Germany .... 357/38 T |
| 3008034 | 11/1980 | Fed. Rep. of Germany ........ 357/38 |
| 59-4077 | 1/1984 | Japan .................................. 357/23.8 |
| 60-5568 | 1/1985 | Japan .................................. 357/23.8 |
| 61-24278 | 2/1986 | Japan .................................. 357/23.1 |
| 2088631 | 6/1982 | United Kingdom .............. 357/38 T |
| 2150753 | 7/1985 | United Kingdom ............... 357/23.8 |

OTHER PUBLICATIONS

A. Goodman, J. Russell, L. Goodman, C. Nuese, and J. Neilson, "Improved COMFETs with Fast Switching Speed and High-Current Capability", IDEM Tech. Digest. 1983, pp. 79-83.

Primary Examiner—Andrew J. James
Assistant Examiner—Donald J. Featherstone
Attorney, Agent, or Firm—Lowe, Price, LeBlanc, Becker & Shur

[57] ABSTRACT

A planar vertical diffusion self aligned conductivity modulated MOSFET comprising a semiconductor island region (70) of a first conductivity type having a high impurity concentration and formed in an island shape in a predetermined region on the surface on the side of a electrode (8) of a semiconductor substrate layer (10) of a second conductivity type having a high impurity concentration.

3 Claims, 3 Drawing Sheets

IDEAL CURRENT FLOW DIRECTION

MODIFIED CONDUCTIVITY MODULATED MOSFET

BACKGROUND OF THE INVENTION

1. Field of the Invention

The present invention relates to a semiconductor device, and more particularly relates to a structure of a monolithic power MOSFET (metal-oxide-semiconductor field effect transistor) having capability of high power; high speed; and high frequency switching operation.

2. Description of the Prior Art

Conventionally, different structures have been known and employed for a high power; high speed, and high frequency device having a low on-resistance.

FIG. 1 is a cross-sectional view showing a structure of a conventional monolithic conductivity alterable MOSFET. First, referring to FIG. 1, the conventional conductivity modulated MOSFET (referred to as a CAT device hereinafter) will be described. Briefly stated, the CAT device is adapted such that an n+-type semiconductor substrate to be a drain region in the planar vertical type DSAMOS (diffusion self aligned MOS) structure formed using a conventional double diffusion method is replaced by a p+-type drain/collector layer. More particularly, the CAT device comprises a p-type (p+-type) semiconductor substrate 7, which is a drain/collector region, having a high impurity concentration, an n-type epitaxial layer 6, which is a drain drift layer, epitaxially grown on one surface of the p+-type semiconductor substrate 7, p-type island regions 5 formed, as base regions, in predetermined regions on one surface of the n-type epitaxial layer 6, n+-type impurity diffusion regions 4 formed, as source/emitter regions, on one surface of the p-type island regions, gate electrodes 2 formed, through a gate insulating film 3, on the n-type epitaxial layer 6 between the adjacent p-type island regions 5, a source/emitter electrode 1 formed on the p-type island regions 5 and the impurity diffusion layers 4. A drain/collector electrode 8 is formed on the other surface of the p+-type substrate 7.

The gate electrode 2 is formed extending to the n+-type source/emitter regions 4, so that an inversion layer, i.e., channel is formed in the p-type island region immediately thereunder in response to the voltage applied thereto.

The n+ region 4 and the p-type island region 5 are formed by ion plantation and diffusion, using as a mask the gate insulating film 3 comprising, for example, SiO₂ and the gate electrode 2. Electrons flow through the path of the source/emitter electrode 1, the n+ source/emitter region 4, the inversion layer formed in the region immediately under the gate electrode 2 within the p-type island region 5, the drain drift layer 6 and the drain/collector layer 7.

The source/emitter electrode 1 is connected to a source/emitter terminal S/E, the gate electrode 2 is connected to a gate terminal G, and the drain/collector electrode 8 is connected to a drain/collector terminal D/C.

FIG. 2 is an equivalent circuit diagram of the CAT device shown in FIG. 1.

The CAT device shown in FIG. 1 ideally comprises a series connection of an MOSFET having an n+-type region 4 as its source, a p-type island region 5 as its channel region, and an n-type epitaxial layer 6 as its drain, and a pin diode D2 having the n-type epitaxial layer 6 as its cathode and a p+-type substrate 7 as its anode. However, as shown in an equivalent circuit diagram of FIG. 2, the CAT device inevitably includes a parasitic thyristor comprising an npn transistor TR1 having the n+-type impurity diffusion region 4 as its emitter, the p-type region 5 as its base, and the n-type epitaxial layer 6 as its collector, and a pnp transistor TR2 having the p-type region 5 as its emitter, the n-type epitaxial layer 6 as its base, and the p+-type substrate 7 as its collector.

Now, the characteristics and the operation of the CAT device shown in FIG. 1 and FIG. 2 will be described.

First, the characteristics will be simply described. When a terminal G and a terminal S/E are short-circuited, and the reverse bias voltage is applied between a terminal D/C and the terminal S/E, a pin diode D2 is reversely biased, resulting in a reverse bias blocking characteristic of the CAT device. When the terminal G and the terminal S/E are short-circuited, and the forward bias voltage is applied between the terminal D/C and the terminal S/E, a diode D1 comprising the p-type island region 5 and the epitaxial layer 6 is reversely biased, resulting in a forward bias blocking characteristic of the CAT device.

Now, referring to FIGS. 1 and 2, the operation of the CAT device will be described.

When the voltage larger than the threshold voltage of a MOSFET is applied between the gate terminal G and the source/emitter electrode terminal S/E, the inversion layer, i.e., channel is formed in the p region under the gate electrode 2, so that the MOSFET is rendered conductive (on-state), and electrons are injected into the drain drift layer 6. At the same time, there occurs a pin diode operating phenomenon in the pin diode D2, so that holes are injected from the p+ drain/collector region 7 into the drain drift layer 6. This causes a conductivity of the drain drift layer 6 to increase, so that the CAT device is turned on with low on-resistance. In such a case, the terminal S/E is connected to a ground or negative potential, and the terminal D/C is connected to a positive potential.

In order to turn off the CAT device, the terminals G and S/E will be short-circuited (i.e. made to be the same potential), and the voltage applied between the terminals is made smaller than the threshold voltage of the CAT device. This causes the MOSFET to become an off-state, so that supply of electrons to the drain drift layer 6 is stopped. When the turn off operation of the CAT device is initiated, a large quantity of minority carriers (holes) injected until then (during an on-state of the device) is concentrated on the drain drift layer 6. The holes are injected into the P+ region 7, so that the current by the corresponding quantity of holes flows into the p-type region 5. If such a phenomenon continues, the degree of concentration of holes on the drain drift layer 6 reduces, whereas the CAT device gradually converts to an off-state. In order to completely turn off the CAT device, plasma of remaining holes and electrons should be completely annihilated by recombination and the like.

The foregoing is a description of the operation of the CAT device where there occurs, at the time of turn off of the CAT device, no latch-up phenomenon in the parasitic thyrister comprising the parasitic transistor TR1 and the parasitic transistor TR2. However, the biggest problem with the CAT device is that the parasitic thyrister causes a latch-up phenomenon at a low current level. If and when the parasitic thyrister causes a latch-up phenomenon and becomes an on-state, the CAT device has no control capability of the gate, and becomes difficult to be turned off. The latch-up phenomenon of the parasitic thyrister is caused by the fact that the parasitic npn transistor TR1 and the parasitic pnp transistor TR2 in the thyrister portion provide mutually a positive feed back operation with a high current density at the time of turn on of the CAT device. The conditions that the parasitic thyrister becomes an on-state through the latch-up phenomenon at the time of turn off are that the sum of respective direct current amplification factors $h_{FE}$ of the npn transistor TR1 and the pnp transistor TR2 is larger than 1, and the voltage drop by the hole current across resistance $R_s$ in the p-type base region 5 of the transistor TR1 is larger than the saturation voltage between the emitter and base thereof, e.g., more than 0.4 to 0.8 V at 300° K.

FIG. 3 is a cross sectional view showing another conventional CAT device which reduced, to some extent, the above described latch-up phenomenon of the parasitic thyrister. A modified CAT device shown in FIG. 3 comprises a $p^+$-type of central base region 50 having a high impurity concentration and formed in the central portion of a p-type base region 5, and a $n^+$-type buffer layer 9 formed between a drain drift layer 6 and a $p^+$-type drain/collector layer 7. The other construction is the same as that of the CAT device shown in FIG. 1. An equivalent circuit of the modified CAT device shown in FIG. 3 is identical to the circuit shown in FIG. 2.

The modified CAT device is adapted such that the direct current amplification factor $h_{FE}$ of a parasitic npn transistor TR1 is reduced by the $p^+$-type of central base region 50 having a high impurity concentration and the direct current amplification factor $h_{FE}$ of a parasitic pnp transistor TR2 is reduced by controlling injection of holes from the $p^+$-type drain/collector layer 7 to the drain drift layer 6 by the $n^+$-type buffer layer 9. Therefore, a current level required for a latch-up phenomenon by the parasitic thyrister at the time of turn on of the CAT device is increased, so that the parasitic thyrister cannot be easily turned on.

However, this modified CAT device has disadvantages that the latch-up phenomenon of the parasitic thyrister can not be fully eliminated even if such modified CAT device is used and that the time of turn off of the CAT device becomes longer since holes accumulated in the drain drift layer 6 are blocked by the $p^+$-type drain/collector layer 7 at the time of turn off of the CAT device.

As described above, the conventional CAT device used as a high power; high speed; and high frequency switching element has the disadvantage of a narrow operational control range by the gate (gate-control range), since the CAT device should be operated in the region smaller than the current level required for a latch-up phenomenon by the parasitic thyrister so as to be normally operated, because of the low current level thereof.

SUMMARY OF THE INVENTION

Accordingly, a primary object of the present invention is to provide a small-sized semiconductor device capable of increasing a gate-control range of a CAT device as well as improving a turn off characteristic thereof by increasing a current level required for a latch-up phenomenon by a parasitic thyrister, so that problems of the above described conventional CAT device can be overcome. The inventive semiconductor device is so constructed as to have a drain/collector region formed in a predetermined island region in a buffer layer. More specifically, the semiconductor device according to the present invention comprises a semiconductor substrate of a first conductivity type having a high impurity concentration, a semiconductor layer of the first conductivity type formed on one surface of the semiconductor substrate, an island shaped impurity diffusion region of a second conductivity type formed in an island shape in a predetermined region on one surface of the semiconductor layer, an impurity diffusion region of the first conductivity type formed in a predetermined surface region of the impurity diffusion region, a control electrode formed through an insulating film on the semiconductor layer and the island shaped impurity diffusion region, and an island shaped semiconductor region of the second conductivity type having a high impurity concentration and formed in a predetermined region on the other surface of the semiconductor substrate.

In accordance with the present invention, since injection of carriers from the semiconductor island region of the second conductivity type having a high impurity concentration into the semiconductor layer of the first conductivity type is controlled by the semiconductor substrate of the first conductivity type, the direct current amplification factor $h_{FE}$ becomes small, and a current level required for the parasitic transistor to latch up is increased.

In addition, since the semiconductor region of the second conductivity type is formed in an island shape, the carriers accumulated in the semiconductor layer of the first conductivity type can be effectively drawn into the exterior at the time of turn off, so that the turn off characteristic can be improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described. However, the parts overlapping with the description of a conventional device will be omitted in the following description of the embodiments.

Figure 4:
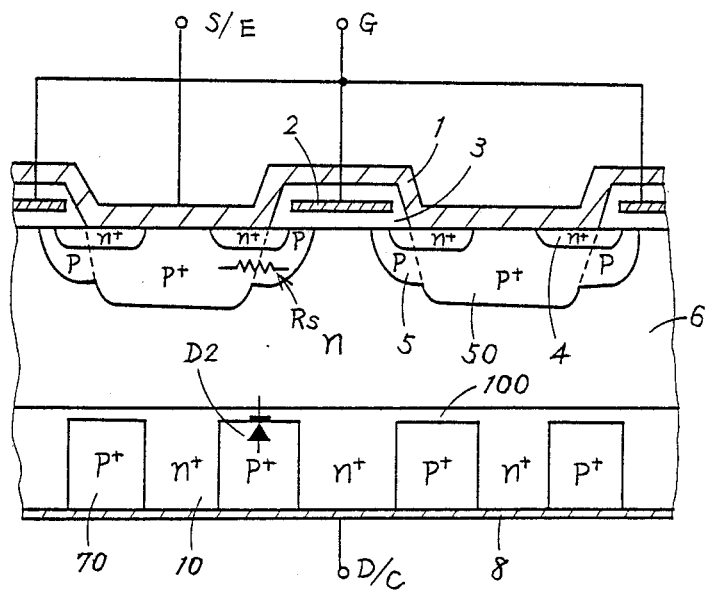
FIG. 4 is a cross sectional view showing a structure of a semiconductor device of an embodiment of the present invention.

FIG. 4 is a cross sectional view showing a structure of a semiconductor device of an embodiment of the present invention. In FIG. 4, the parts identical or corresponding to those of a conventional semiconductor device have identical reference numerals.

Figure 3:
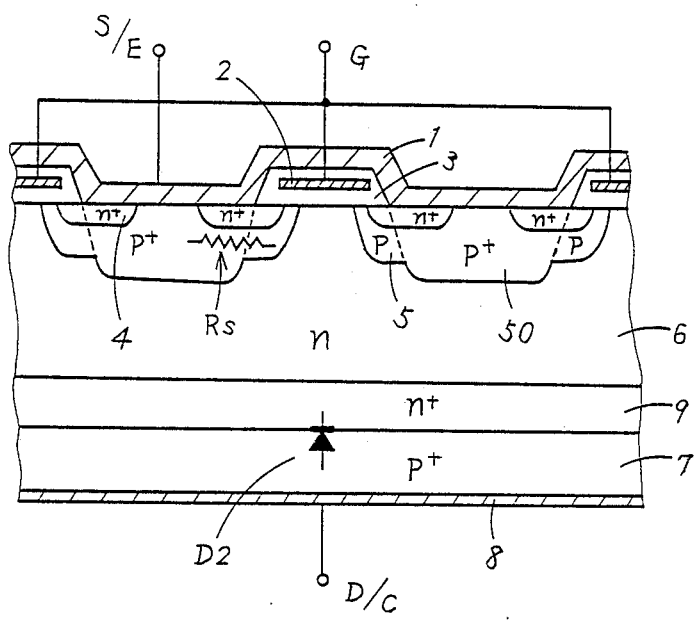
FIG. 3 is a cross sectional view showing a structure of a conventional improved CAT device.

Unlike the conventional CAT device shown in FIG. 3, the semiconductor device according to the present invention shown in FIG. 4 comprises an n+-type drain/collector layer 10 having a high impurity concentration, and an p+-type semiconductor region 70 having a high impurity concentration and formed in an island shape having a predetermined depth, on one surface of the drain/collector layer 10. The p+-type semiconductor region 70 is adapted to be aligned with a source/emitter region 4. An n+-type semiconductor region 100 between the p+-type semiconductor region 70 and an n-type drain drift layer 6 serves as a n+-type buffer layer. Similarly to FIG. 3, a p+-type base central region 50 is formed in the central portion of a p-type base region 5. A parasitic npn transistor in a vertical MOSFET comprises of the n+-type source/emitter region 4, the p-type base region 5, the p+-type base central region 50, the n-type drain drift layer 6, and n+-type drain/collector layer 10, whereas a parasitic pnp transistor in the MOSFET comprises of the p-type base region 5, the p+-type base central region 50, the n-type drain drift layer 6, the n+-type drain/collector layer 10, and the p+-type drain/collector region 70. Both the transistors form parasitic thyrister regions.

Figure 5:
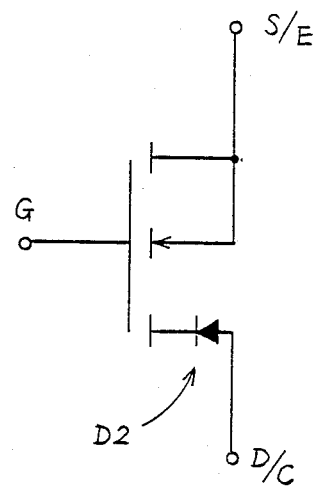
FIG. 5 is an equivalent circuit diagram of the semiconductor device of the present invention.

FIG. 5 is a diagram showing an equivalent circuit of a CAT element shown in FIG. 4. In FIG. 5, the equivalent circuit of the CAT element provides an n-channel MOSFET having a parasitic pin diode $D_2$ on a drain/collector side of the device.

Now, the operation of the CAT element will be described. Since the p+-type drain/collector region 70 is partially formed on the other surface of the n+-type drain/collector layer 10, in alignment with each n+-type source/emitter region 4, and the n+-type buffer layer 100 is formed on the bottom surface of the p+-type drain/collector region 70, holes are partially injected from the p+-type drain/collector region 70 (a p+ emitter of the parasitic pnp transistor) into the drain drift layer 6, but such injection is restrained by the n+-type buffer layer 100. Therefore, the transportation efficiency in the base region of the parasitic pnp transistor is reduced, and the direct current amplification factor $h_{FE}$ thereof is largely decreased as compared with that of the conventional CAT element. The holes injected from the p+-type drain/collector region 70 flows through the drain drift layer 6 straight toward an upper direction in the drawing with the holes squeezed. A small part of the holes reaches the peripheral portion of the p-type base region 5, and a greater part of the holes reaches the p+-type base central region 50 and a source/emitter electrode 1. As a result, the voltage drop Vs across resistance Rs in the base regions 5 and 50 due to the hole current becomes smaller as compared with that of the conventional CAT element. Thus, since the direct current amplification factor $h_{FE}$ of the parasitic pnp transistor decreases in the CAT element, and the voltage drop Vs in the p-type base region 5 and the p+-type base central region 50 of the parasitic npn transistor becomes small, the parasitic thyrister causes no latch-up phenomenon in a current level required for a latch-up phenomenon in the conventional CAT device. That is, the current level required for a latch-up phenomenon by the parasitic thyrister considerably increases, so that the CAT device can be easily turned off, resulting in improvement of the high speed; high frequency switching characteristic thereof. Further, since the level required for a latch-up phenomenon by the parasitic thyrister increases in the CAT device according to the present invention as described above, the gate control range thereof becomes wider as compared with that of the conventional CAT device, and a CAT device having a high current density can be obtained, so that the CAT device can be obtained with a small-size and at a low cost by making the chip size small.

Concerning conductivity modulation of the drain drift layer 6, efficient hole injections to the drain drift layer 6 from the p+-type drain/collector layer 70 formed in an island shape and aligned with the source/emitter region 4 is fully effective, and conductivity modulation due to hole injection in the region immediately under the p+-type base central region 50 is not required. The present structure allows substantially the same conductivity modulation effect as that in the conventional CAT device, so that the on-voltage thereof can be decreased.

In the conventional CAT element, since a p+-type drain/collector layer 7 is formed throughout the drain drift layer 6, holes accumulated in the drain drift layer 6 during the time of turn-on state is blocked by the p+-type drain/collector layer 7 at the time of turn off and hence cannot easily pass through, whereas in the present inventive CAT element, holes are blocked only in the narrow range of the p+-type drain/collector region 70 and most of the holes can easily pass through to the n+-type drain/collector layer 10 around the region 70, so that the CAT element can be easily turned off, and a high speed, and high frequency switching characteristic can be improved.

Figure 6:
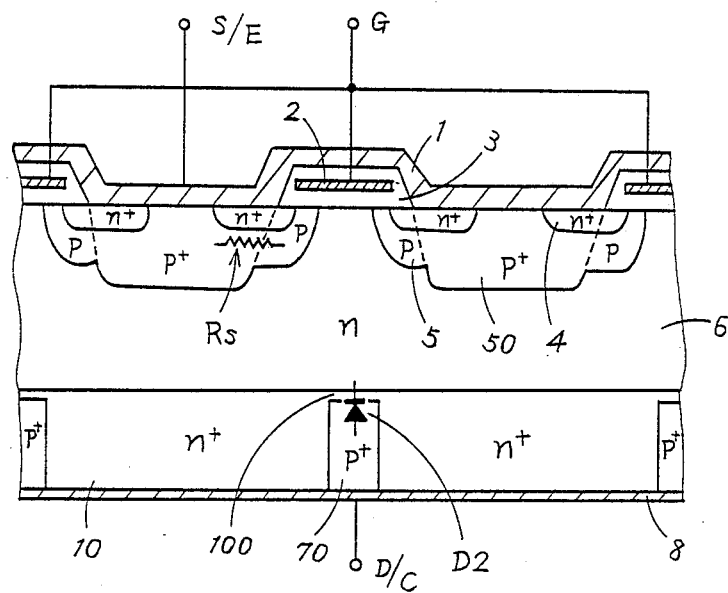
FIG. 6 is a cross sectional view showing a structure of a semiconductor device of another embodiment of the present invention.

FIG. 6 is a cross sectional view showing a structure of the semiconductor device of another embodiment of the present invention. The semiconductor device shown in FIG. 6 comprises a p+-type drain/collector region 70 formed in an island shape so as to be aligned with a gate electrode 2. The remainder is identical to that of the device shown in FIG. 4. In the FIG. 6 embodiment, the holes are injected only at locations (i.e. below the gate electrode 2) of the drain drift layer 6 which are effective for conductivity modulations. Therefore, the total quantity of injected holes is much less. Accordingly, a less quantity of holes reach the p-type base region 5 and pass through into a source/emitter electrode 1. Therefore, the voltage drop Vs across resistance Rs due to the hole current of a parasitic npn transistor becomes small. In addition, since injection of the holes from the p+-type drain/collector layer 70 is restrained by an n+-type buffer layer 100, the direct current amplification factor $h_{FE}$ of a parasitic pnp transistor decreases. Correspondingly, a current level required for a latch-up phenomenon by a parasitic thyrister decreases. That is, an arrangement of the p+-type drain/collector layer 70 shown in FIG. 6 allows the same efficiency as that in the semiconductor device of the structure shown in FIG. 4.

Figure 1:
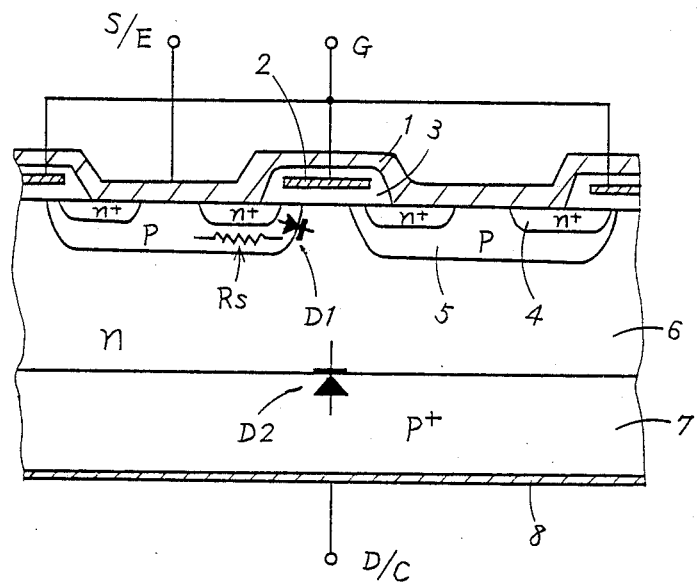
FIG. 1 is a diagram showing a structure of a conventional conductivity modulated MOSFET (CAT) device which is a high power; high speed; and high frequency switching element.
Figure 2:
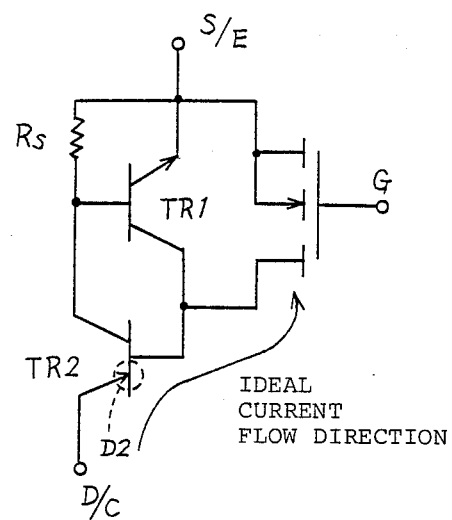
FIG. 2 is an equivalent circuit diagram of the conventional CAT device.

Although the CAT element is shown as an n-type in the above described embodiments, it will be apparent to those skilled in the art that the present invention can be applied to a p-type CAT element in which conductivity type in each layer and each region in FIG. 1 is opposite.

As described in the foregoing, in accordance with the present invention, the semiconductor is adapted such that the drain/collector region of the second conductivity type is formed in an island shape in the predetermined region within the drain/collector region of the first conductivity type, so that the current level required for a latch-up phenomenon by the parasitic thyristor can be increased, the gate-control range thereof can be made wider and the turn off characteristic thereof can be improved, whereby a semiconductor device having capability of high power; high speed; and high frequency switching operation can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having improved speed and frequency switching characteristics, comprising:
   - a first drain/collector layer of a first semiconductor conductivity type having a high impurity concentration, said layer having upper and lower major surfaces;
   - a drift layer of the first semiconductor conductivity type formed on said upper major surface of said first semiconductor layer;
   - base region of a second semiconductor conductivity type formed in an island shape in predetermined regions on an upper surface of said drift layer;
   - a source/emitter island region of the first semiconductor conductivity type having a high impurity concentration and formed in an island shape in predetermined regions of an upper surface of said base regions; and
   - a control electrode formed through an insulating film in a predetermined region on said upper surface of said drift layer and on an upper surface of said base regions;
   - a second drain/collector region of the second semiconductor conductivity type having a high impurity concentration and formed in an island shape on said lower major surface of said first drain/collector semiconductor layer and in alignment with said source/emitter island region.

2. A semiconductor device having improved speed and frequency switching characteristics, comprising:
   - a first drain/collector layer of a first semiconductor conductivity type having a high impurity concentration, said first drain/collector layer having upper and lower major surfaces;
   - a drift layer of the first semiconductor conductivity type formed on said upper surface of said first drain/collector layer;
   - base regions of a second semiconductor conductivity type formed in an island shape in predetermined regions on an upper surface of said drift layer;
   - source/emitter island regions of the first conductivity type having a high impurity concentration, each formed in an island shape in a predetermined region of an upper surface of said base regions spaced apart from others of said source/emitter island regions;
   - a gate electrode formed through an insulating film in a predetermined region on said upper surface of said drift layer and on an upper surface of said base regions;
   - a second drain/collector region of the second semiconductor conductivity type having a high impurity concentration and formed in an island shape on said lower major surface of said first drain/collector layer above, and in alignment with, said gate electrode, said second drain/collector region having a width which is less than a width of said gate electrode.

3. A semiconductor device having improved speed and frequency switching characteristics, comprising:
   - a first drain/collector layer of a first semiconductor conductivity type having a high impurity concentration, said layer having upper and lower major surfaces;
   - a drift layer of the first semiconductor conductivity type formed on said upper major surface of said first semiconductor layer;
   - first and second spaced apart base regions of a second semiconductor conductivity type formed in an island shape in predetermined regions on an upper surface of said drift layer, each of said base regions including first and second source/emitter island regions of the first semiconductor conductivity type having a high impurity concentration and formed in an island shape in predetermined, spaced apart, regions of an upper surface of each base region;
   - a control electrode formed through an insulating film in a predetermined region on said upper surface of said drift layer between said first and second base regions and on an upper surface of said first and second base regions;
   - a plurality of spaced apart second drain/collector regions of the second semiconductor conductivity type having a high impurity concentration, each formed in an island shape on said lower major surface of said first drain/collector semiconductor layer and in alignment with a corresponding one of said source/emitted semiconductor island regions.

* * * * *